United States Patent [19]

Fegen

[11] 3,777,052

[45] Dec. 4, 1973

[54] SUPPORT FOR CIRCUIT BOARDS

[75] Inventor: James F. Fegen, Morton Grove, Ill.

[73] Assignee: Richco Plastic Company, Chicago, Ill.

[22] Filed: Feb. 28, 1972

[21] Appl. No.: 229,800

Related U.S. Application Data

[63] Continuation-in-part of Ser. No. 120,830, March 4, 1971, Pat. No. 3,688,635.

[52] U.S. Cl. .................. 174/138 D, 24/73 P, 85/5 R

[51] Int. Cl. ........................ F16b 19/00, A44b 21/00

[58] Field of Search ................... 174/40 CC, 138 D, 174/158 R, 164; 24/73 R, 73 PM, 73 PF, 73 HS, 208 A, 213 R, 221 L, 73 P; 85/5 R, 5 P, 80, DIG. 2; 317/101 R, 101 CM, 101 D, 101 DH

[56] References Cited

UNITED STATES PATENTS

| | | | |
|---|---|---|---|
| 2,442,754 | 6/1948 | Beam | 174/138 D UX |
| 2,885,822 | 5/1959 | Onanian | 24/73 PF UX |
| 3,040,401 | 6/1962 | Von Rath | 24/73 HS |
| 3,154,281 | 10/1964 | Frank | 174/164 UX |
| 3,373,463 | 3/1968 | Wells | 24/73 PM |
| 3,412,437 | 11/1968 | Bennett | 85/5 R X |
| 3,550,217 | 12/1970 | Collyer | 85/5 R X |
| 3,568,263 | 3/1971 | Meehan | 174/138 D UX |
| 3,568,964 | 3/1971 | Perkins | 248/71 X |
| 3,651,545 | 3/1972 | Hara | 174/138 D UX |
| 3,688,635 | 9/1972 | Fegen | 85/5 R |

FOREIGN PATENTS OR APPLICATIONS

| | | | |
|---|---|---|---|
| 938,327 | 10/1963 | Great Britain | 174/138 D |

*Primary Examiner*—Laramie E. Askin
*Attorney*—Martin Faier

[57] ABSTRACT

A support for circuit boards having means for detachably securing the support to a chassis, flexible means for holding the circuit board in position, and positive locking and unlocking means for removably securing a circuit board on the support, said support adapted to securely mount a circuit board in predetermined position spaced apart from a chassis.

3 Claims, 5 Drawing Figures

SUPPORT FOR CIRCUIT BOARDS

This application is a continuation-in-part of my co-pending application, Ser. No. 120,830, filed Mar. 4, 1971, for a CIRCUIT BOARD SUPPORT, now U.S. Pat. No. 3,688,635, granted Sept. 5, 1972.

BACKGROUND OF THE INVENTION

This invention relates to supports for mounting components in electrical and electronic equipment, and is more particularly directed to a circuit board of plastic dielectric insulating material of one-piece construction, which may be used for removably securing and supporting a printed circuit board on and spaced apart from a chassis. The invention is especially concerned with positive locking and unlocking means for detachably securing the support on the chassis and for mounting the circuit board on the support.

The device embodying the present invention comprises a rigid support member having its lower end a flexible member for securing the support in upright position on a chassis and on its upper end a positive locking coupling for securing a circuit board on the support. The lower flexible means includes a member adapted to project into a mounting hole in the chassis which has a return portion including a shoulder for bearing against the underside of the chassis and the side wall of the mounting hole. The upper end of the support includes an arm carried by the circuit board mounting means adapted to be deflected into circuit board locking and unlocking positions. The device disclosed herein is sufficiently versatile to accommodate a variety of chassis and circuit board thicknesses.

It is therefore an object of the present invention to provide a circuit board support of one piece construction including positive support — chassis and circuit board — support locking means, which is easy to manufacture and simple to use without installation hardware or tools.

Another object of the invention is to provide a circuit board support which will flexibly and positively lock onto a chassis in upright position and which will permit the circuit board to be detachably secured on the support.

Other objects and advantages of the invention will become apparent as this description proceeds, taken in conjunction with the accompanying drawings.

DETAILED DESCRIPTION OF THE INVENTION

Figure 1:
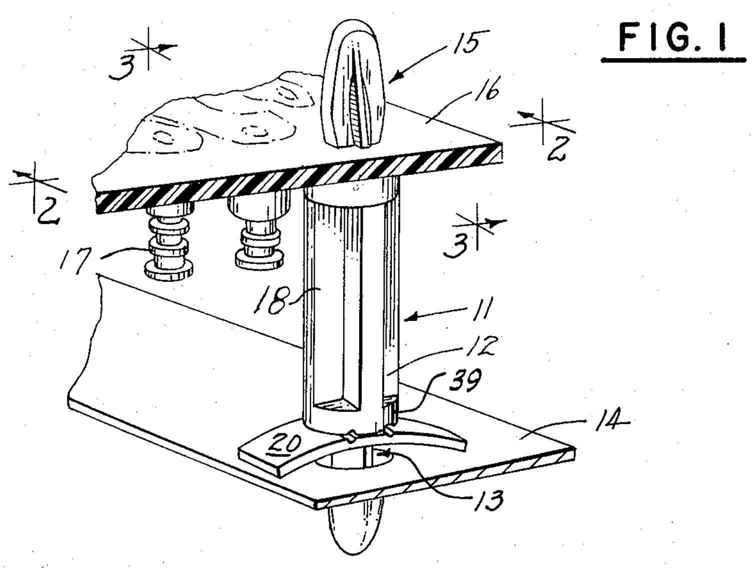
FIG. 1 is a perspective view of one embodiment of the invention, mounted on a chassis and supporting a circuit board showing the edges of the chassis and circuit board in section.
Figure 2:
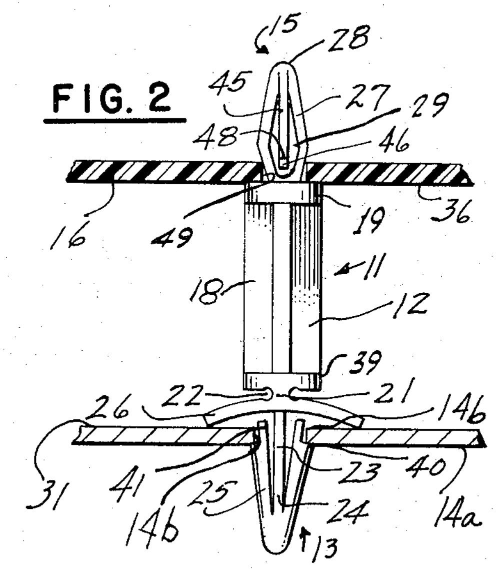
FIG. 2 is a side elevational view of a circuit board support, showing the circuit board and chassis in section, taken on line 2 — 2 of FIG. 1.
Figure 3:
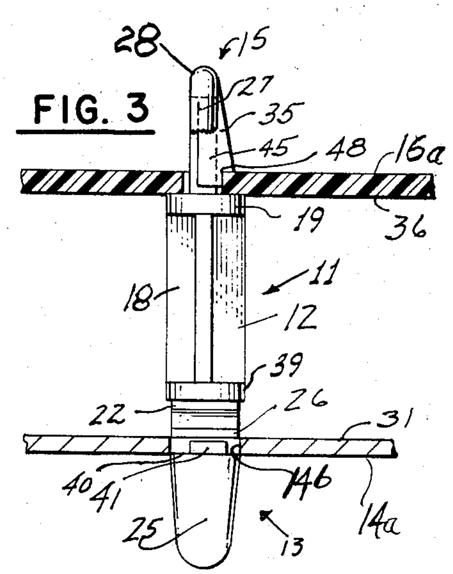
FIG. 3 is a side elevational view at 90° to FIG. 2, taken on line 3 — 3, with the board and chassis in section and part of the support coupling broken away to show the circuit board locking arm.
Figure 4:
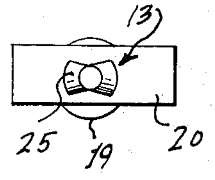
FIG. 4 is a bottom plan view of the support shown in FIG. 2.
Figure 5:
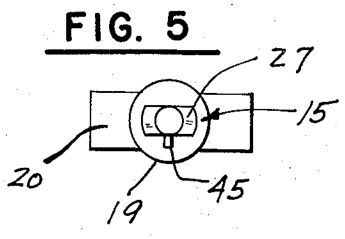
FIG. 5 is a top plan view of the support shown in FIG. 2.

The support 11 comprises an upright shaft 12, having at its lower end a flexible locking member 13 for securing the support in an upright position on a chassis 14, and on its upper end a resilient coupling 15 for removably securing and supporting a circuit board 16 having electrical components 17 suspended therefrom in elevated position above and spaced apart from the chassis.

The shaft 12 preferably has reinforcing ribs 18 and upper and lower collars, 19 and 39, respectively, for maintaining the shaft in rigid upstanding position, particularly under load of the circuit board 16 and during assembly of the board onto the supports. The upper collar 19 also functions as a support and stop surface for the circuit board.

The locking member 13 has a base 20, joined to the shaft by a web 21 having flexure grooves 22 on either side thereof, and a prong 23, comprising stem portion 24 and return portions 25 extending from the base. Each return portion includes a shoulder 40 for bearing against the underside **14*a* of the chassis and an extension 41 for re-entering the chassis hole 14*b* and bearing toward its side walls. Opposed free ends 26 of base 20 are arched away from the chassis 14**.

At the upper end of the shaft 12, remote from the chassis locking member 13, is a coupling 15 for securing the circuit board thereon. This coupling has side walls 27 which are tapered outwardly from the shaft and then inwardly toward its upper end 28 to define a generally diamond shaped aperture 29 through the coupling. Suspended from the upper end 28 and bisecting the aperture 29 is a flexible arm 45 having a portion 46 normally entering an aperture 49 in the circuit board 16 and a shoulder 48, carried by detent arm portion 35, normally bearing against the upper surface **16*a*** of the circuit board.

In use, the circuit board components are preferably first assembled on the circuit board. The locking member 13 is press fit into the aperture **14*b* preformed in the chassis 14, so that the free ends 26 of the base 20 bear against the upper surface 31 of the chassis and the return portions 25** snap-lock against the underside of the chassis. The mounting may accommodate chassis of various thickness because the return portions and the free ends of the base are flexible.

The assembled circuit board 16 has a suitable aperture 49 preformed therethrough, and the coupling 15 is press fit through the circuit board aperture so that the lower surface 36 of the board rests upon the upper collar 19 of the shaft 12. The side walls 27 are yieldable into the diamond shaped aperture 29 to permit snap retention of the board onto the support and to allow the support to accommodate boards of minor thickness and aperture variations. During this press fitting, the flexible arm 45 is deflected to permit the board to pass thereover until the shoulder 48 returns to normal position, at which time the board is locked onto the support.

Removal of the support from the chassis aperture is accomplished by pinching the return portions of the prong together until the shoulder 40 is free of the chassis aperture, and lifting is assisted by flexing of the free ends of the base to normal position. Removal of the circuit board from the support is accomplished by deflecting the arm 45 until the shoulder 48 is free of the circuit board aperture, and lifting the board from its seat on the support collar 19. Lifting is assisted by the cam action of the tapered side 35 of the arm urging the board upwards.

The circuit board support disclosed in this application is preferably injection molded in one piece from nylon, although other moldable resilient materials having dielectric insulating properties may be utilized.

While I have illustrated and described a preferred embodiment of my invention, it is apparent that various changes and modifications in the details of the structure may be made without departing from the spirit or scope of the invention. Accordingly, I do not desire to be limited to the exact construction described and illustrated.

I claim:

1. A one-piece support of plastic dielectric insulation material for mounting an apertured circuit board spaced from an apertured chassis, said support comprising a rigid shaft, a resiliently yieldable base at one end of said shaft adapted to bear against the top surface of the apertured chassis, mounting means extending from the base adapted to be projected through the chassis aperture, flexible return portions on said mounting means having free ends adapted under tension of the resiliently yieldable base to partially re-enter the chassis aperture, straight abrupt shoulders adjacent the free ends of the return portions adapted to abut the chassis surface in the area surrounding its aperture so as to prevent withdrawal of the mounting means from the aperture, and a coupling member on the other end of the shaft adapted to enter the circuit board aperture for removably securing said circuit board on the support comprised of diverging and converging yieldable walls and a deflectable arm integral with and between said walls adapted to enter into the circuit board aperture to limit deflection thereof, an abrupt shoulder on said arm adapted to be abutted by the circuit board to prevent unintended separation of the board from the coupling member.

2. The support recited in claim 1, in which said shaft comprises a collar on each end of the shaft spaced apart by reinforcing ribs.

3. The support recited in claim 1, in which the arm connects the upper end of said walls.

* * * * *